United States Patent [19]

Siemon et al.

[11] Patent Number: 4,687,681

[45] Date of Patent: Aug. 18, 1987

[54] METHOD OF MAKING A CHEMICALLY BONDED COATING ON A FIBROUS OR FILAMENTOUS SUBSTRATE

[75] Inventors: John T. Siemon, Indiana Township, Allegheny County; Rajender K. Sadhir, Plum Boro, both of Pa.

[73] Assignee: Westinghouse Electric Corp., Pittsburgh, Pa.

[21] Appl. No.: 701,336

[22] Filed: Feb. 13, 1985

[51] Int. Cl.[4] ............................................. B05D 3/06
[52] U.S. Cl. ....................................... 427/40; 427/38; 427/41; 427/96; 427/99; 428/260
[58] Field of Search ...................... 427/38, 39, 40, 41, 427/96, 99, 385.5, 389.9; 428/260

[56] References Cited

U.S. PATENT DOCUMENTS

| | | | |
|---|---|---|---|
| 3,817,771 | 6/1974 | Nakayama et al. | 427/42 |
| 4,123,308 | 10/1978 | Nowlin et al. | 427/42 X |
| 4,131,691 | 12/1978 | Morley et al. | 427/41 |
| 4,188,426 | 2/1980 | Averbach | 427/40 |
| 4,524,089 | 6/1985 | Haque et al. | 427/38 |
| 4,526,806 | 7/1985 | Haque et al. | 427/41 |
| 4,533,369 | 8/1985 | Okita | 427/41 X |

Primary Examiner—Thurman K. Page
Attorney, Agent, or Firm—R. D. Fuerle

[57] ABSTRACT

Disclosed is a method of coating a fibrous or filamentous organic polymeric substrate by forming a liquid which comprises an organic compound having a vapor pressure of less than about 400 mm at room temperature, applying the liquid to the substrate, evaporating any solvent which is present, and exposing the liquid to an ionized non-polymerizing inorganic gas. Also disclosed is a coated substrate comprising a fibrous or filamentous substrate made of an organic polymeric material and a saturated aliphatic hydrocarbon coating on the substrate polymerized and chemically bonded to the polymeric material. A laminate is made by impregnating the treated substrate with an organic impregnating resin, heating the impregnated treated substrate to evaporate any solvent and to partially cure the organic impregnating resin, forming a prepreg, forming a stack of a plurality of prepregs, and heating the stack under pressure to fully cure the impregnating resin. Copper can be placed at one or both ends of the stack prior to fully curing the impregnating resin in order to form a circuit board.

14 Claims, 1 Drawing Figure

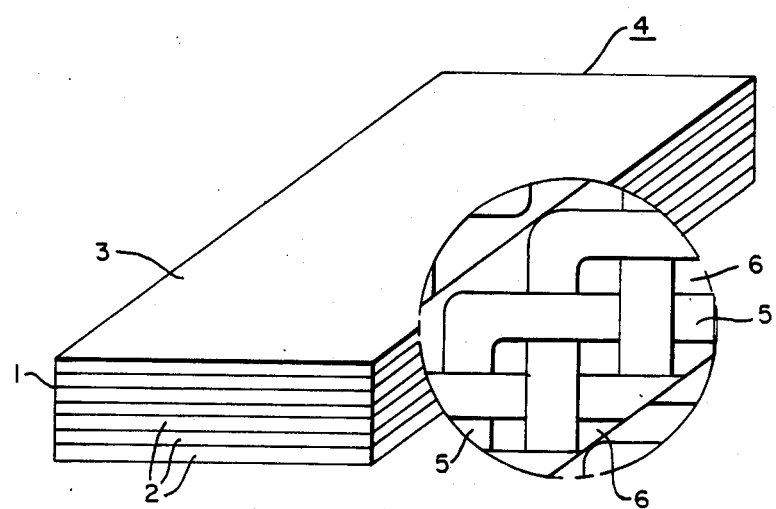

METHOD OF MAKING A CHEMICALLY BONDED COATING ON A FIBROUS OR FILAMENTOUS SUBSTRATE

BACKGROUND OF THE INVENTION

In making a laminate, a fibrous substrate is impregnated with a resin which is then partially cured to form a prepreg, and a stack of prepregs is heated under pressure to form the laminate. The properties of the laminate depend to a significant degree on the characteristics of the interface between the substrate and the resinous matrix. In particular, the strength of the laminate is usually a function of the adhesion between the fibrous substrate and the resinous matrix. Many efforts have been made to alter the surface characteristics of fibrous substrates to increase the desirable properties of laminates. These include physical or chemical treatment of the fibrous material itself, as well as coating the fibrous material with another material which is more compatible with the resinous matrix. Many difficulties have been encountered using these techniques, depending on the particular technique, but one problem that has not been overcome is how to bond a compound to the fibrous substrate when the compound and substrate do not have a polymerizable structure and therefore are not polymerizable. Such compounds include the saturated aliphatic hydrocarbons such as pentane, hexane, and dodecane.

Another problem arises when the laminates are made from a polyaramide fibrous substrate in an epoxy resinous matrix for use as a printed circuit board. These circuit boards are used for very high speed circuit carriers (VHSIC) and have leadless chip carriers soldered directly onto the circuit board. While the thermal expansion of the polyaramide fabric-epoxy circuit board matches that of the solder fairly closely, on thermal cycling microcracks tend to appear in the circuit board which can break the circuit, resulting in a failure of the equipment. It is not known whether these microcracks begin at the interface of the polyaramide fibers and the resinous matrix or begin within the resinous matrix itself.

SUMMARY OF THE INVENTION

We have discovered a method of making a coating on a fibrous or filamentous substrate which results in chemical covalent bonding between the coating and the substrate. As a result, we can alter the surface characteristics of a wide variety of substrates to produce a more compatible interface with the matrix material in a laminate. While the coatings produced according to this invention are polymerized, surprisingly, we can produce coatings of compounds which lack a polymerizable structure and therefore are not normally polymerizable. As a result, we can produce polymerized and chemically bonded coatings on substrates which have never before been made.

DESCRIPTION OF THE INVENTION

The accompanying drawing is an isometric view partially in section and having an enlargement window showing a certain presently preferred embodiment of a laminate according to this invention.

In the invention, a stack 1 of prepregs 2 having a copper foil 3 at one end of the stack has been heated under pressure to form a laminate 4. Each prepreg 2 consists of a fibrous substrate 5 impregnated with a laminating varnish 6.

The substrate material used in this invention may be in the form of a fiber or a film. If it is in the form of a fiber it may be woven into a fabric, laid into a mat. The substrate material can be made of any fiber or film forming organic polymer including polyesters, polyamides, polyaramides, polyolefins such as polyethylene, polypropylene and polybutylene, polyimides, polycarbonates, epoxies, polyethers, polyamic acids, polyurethanes, and polyaliphatics. The preferred substrate material is polyaramide as that has good thermal stability and a good strength to weight ratio.

The material used to form the coating may be any organic compound that has a vapor pressure of less than about 400 mm, and preferably less than 10 mm, at room temperature. Compounds that have higher vapor pressures are unsuitable because the process of this invention requires the use of low pressures, and a low vapor pressure compound would evaporate before very much of it could be polymerized. The organic compound can be described as a grafting species because it is chemically grafted onto the substrate material. Suitable grafting species include ethylenically or acetylenically unsaturated monomers or oligomers up to $n=10$. Suitable ethylenically or acetylenically unsaturated oligomers include 1,4-butadiene, 1,2-butadiene, acrylic acid, acrylamide, acrylonitrile, propylene, vinyl acetate, vinyl chloride, allylamine, methyacrylic acid, methyacrylamide, and methyacrylonitrile. Carbonyl containing compounds such as vinyl acetate, methyl ethyl ketone, and butyraldehyde can also be used. Other suitable grafting species include organic acids such as maleic acid, acetic acid, malonic acid, and the fatty acids such as stearic acid. Carboxyl containing compounds can also be used as well as esters, anhydrides, imides, amides, and amic acids. Grafting species which are ethylenically or acetylenically unsaturated are preferred as they are easier to polymerize. The ethylenically or acetylenically unsaturated grafting species are preferably amine or carboxyl terminated oligomers as the presence of the amine or carboxyl group permits the coating to react with many matrix materials, including epoxy resins. While a wide variety of compounds can be grafted using the process of this invention, whichever compound is selected must be in a liquid form. It can be made into a liquid form either by melting it or by dissolution in a solvent.

If the grafting species is dissolved in solvent, the solvent must not dissolve the fibrous substrate, and it should preferably have a boiling point under about 80° C. as solvents that have higher boiling points require too long to evaporate later in the process. Suitable solvents include acetone, methyl ethyl ketone, chloroform, diethyl ether, ethyl alcohol, dimethylformamide, tetrahydrofuran, perchloroethylene, carbon tetrachloride, and water. The preferred solvent is acetone because it has a low boiling point and readily dissolves most grafting species at a high solids content. The solid content of the solution will depend upon how much oligomer it is desired to deposit upon the fibrous substrate. A grafting species that forms a very viscous solution will require more solvent if less grafting species is to be deposited on the fiber substrate.

In the first step of the process of this invention, the liquid grafting species is applied to the fibrous substrate. This may be accomplished by dipping the fibrous substrate into the liquid grafting species, by spraying, or other application technique. Excess liquid grafting species is drained off and any solvent that is present is evaporated.

In the second step of the process of this invention, the coated substrate is contacted with a plasma, an ionized gas. Both the grafting species and the substrate are contacted with a plasma while they are in contact with each other. The gas used to form the plasma can be any gas that will not self-polymerize (self-polymerizing gases include methane, acetylene, benzene, styrene, carbon tetrachloride, tetrafluoroethylene, and ethylene). In addition, the gas should be non-organic. Suitable gases include the noble gases, such as hydrogen, neon, argon, krypton, and xenon, and other gases such as nitrogen, oxides, sulfur tetrafluoride, and hydrogen sulfide. Oxygen or nitrogen is preferred because they are non-toxic, readily available, and non-polluting.

The gas can be ionized in a variety of ways, but the preferred way is in a capacitively or inductively generated electric field. This can be done using RF, microwave, AC, or DC current. Radio frequency is preferred as it seems to work well and is readily available. The resulting plasma is a non-equilibrium plasma in that the gas temperature is near ambient temperature although the electron temperature is several thousand degrees centigrade. (Equilibrium plasmas should not be used as they may damage the substrate.) The coated substrate is contacted with the ionized gas for about 2 to about 30 minutes. This results in the polymerization of the coating on the substrate and in the chemical bonding of the coating to the substrate.

The treated coated substrate can now be used for a variety of applications, such as the preparation of a laminate. A laminate can be prepared by using the treated coated substrate in the same way that other fibrous substrates are used. That is, the substrate is impregnated with a varnish, the varnish is partially cured to form a prepreg, the prepregs are then stacked and heated under pressure to form the laminate. Particularly useful are fibrous substrates where the fibrous material is polyaramide, the coating is butadiene, and the impregnating resin is an epoxy. Butadiene coated polyamide fibers may also be useful in preparing tires as the butadiene coating makes the polyaramide fibers compatible with the butadiene matrix used in the tire. If the fibrous substrate is a sheath of fibers, pultruded products or tow cables can be prepared. By coating with a compound such as butadiene, these can be made moisture resistant if the fibrous substrate is a polyamide. Substrates can also be made non-self-abrading by coating with low friction materials. Many other desirable properties can be incorporated onto the substrates without changing the bulk properties of the substrate.

Another useful application for the process of this invention is the coating of compounds onto a substrate that are not polymerized because they lack a polymerizable structure. Such compounds include the saturated aliphatic hydrocarbons such as pentane, octane, and dodecane.

The following example further illustrates this invention:

EXAMPLE 1

A 3% solids (by weight) solution in acetone was prepared of amine and carboxyl terminated 1,4-polybutadiene sold by BF Goodrich under the trade designation "CTBN." A woven polyaramide fabric sold by DuPont as "Kevlar," having a $4.7 \times 10^{-4}$ inch filament size and 4 inches by 4 inches in size was passed through the solution with a 1 to 15 minute residence time in it. The acetone remaining on the fabric was evaporated using hot air at 60° C. and a vacuum.

The fabric was then placed in a plasma reactor which consisted of a 300 watt, 13.56 mHz capacitively coupled radio frequency generator having impedance matching circuitry and a pair of activator plates, a pyrex glass chamber with 5 activator tubes, a vacuum system, and a gas metering system. Oxygen gas was bled into the reactor at 40 cc/min to a pressure of 1 millimeter of mercury. The plasma was generated using an RF power setting of 150 watts and a contact time of 20 minutes. The treated fabric was then removed from the reactor and impregnated with an epoxy resin:

A 90° peel test was performed on both the treated and the untreated fabrics, using at least 6 samples of each. The samples were tested by applying an adhesive which consisted of 100 parts by weight diglycidyl ether of bisphenol A epoxy resin sold by Dow Chemical Co. under the trade designation "DER332" and diethylenetriamine to the laminates. Pairs of treated or untreated Kevlar fabrics were bonded together for 10 minutes at 100° C. and 100 psi. Samples were allowed to cool and equilibrate at ambient conditions for at least 16 hours before testing. The following table gives the pounds required to separate the pairs of laminates.

| Control | Plasma Grafted With Carboxyl Terminated Polybutadiene |
| --- | --- |
| 2.4 | 3.2 |
| 1.9 | 3.0 |
| 2.4 | 2.8 |
| 2.4 | 3.1 |
| 1.9 | 3.2 |
| 2.6 | 3.4 |
| 2.5 | 3.1 ± 6% lbs./inch |
| 2.5 | |
| 1.8 | |
| 2.3 ± 13% lbs./inch | |

The results of these tests show a significant increase in peel strength after plasma activation of the butadiene coated polyaramide fibers.

EXAMPLE 2

To determine the shear strength of Kevlar/epoxy laminates, by the short beam shear method (ASTM D-2344), 4 inches×4 inches squares of plasma grafted Kevlar fabric were impregnated with the NEMA grade standard "FR-4" epoxy resin having the following formulation:

| | |
| --- | --- |
| A liquid diglycidyl ether of bisphenol A sold by Shell Chemical Co. as "Epon 829" | 100.0 phr |
| Tetrabromo-bis-phenol-A | 49.9 |
| Dicyandiamide | 3.7 |
| Benzyl dimethyl amine | .04 |
| Methyl Cellosolve | 47.2 |

The impregnated fabric was B-staged by heating in an oven at 150° C. for 7.5 min. Thirty B-staged plies were stacked and laminated for one hour at 375 psi pressure and 180° C. to give a cured laminate of 0.25 inches nominal thickness. The laminate was allowed to cool to room temperature and equilibrate for 16 hours under ambient conditions. Test samples 1.125 inches×0.250 inches were then cut from the laminate and were tested for shear strength. Control samples were also prepared and tested in a similar manner.

In addition, the laminates were thermally cycled from −80° to 100° C. 30 times and then examined by scanning electron microscope (SEM) micrographs to determine whether microcracking had occurred. The treated laminates contained significantly fewer microcracks than did the control.

An amine oligomer sold by Jefferson Chemical Company under the trade designation "Jeffamine 403" was plasma grafted onto poly-p-phenylene terephthalamide woven fibers sold by DuPont under the trade designation "Kevlar 49" using nitrogen, oxygen, and argon gases. The effect of grafting on the short beam shear strength is given in the table that follows.

| Laminate | Resin % Content | Short Beam Shear Strength % |
|---|---|---|
| Control | 39.49 | 4465 ± 8% |
| "Jeffamine"-grafted-"Kevlar 49" | 38.89 | 4507 ± 6% |
| Carboxyl terminated polybutadiene-grafted-"Kevlar 49" | 28.5 | 4985 ± 4% |
| N—vinylbenzyl-N—2(trimethoxysilyl) probyl amino ethyl chloride-grafted-"Kevlar 49" | 34.67 | 3222 ± 7% |

The effect of grafting with the plasma of different gases on the peel strength is given in the following table:

| Sample | Peel Strength lb/in. |
|---|---|
| Blank | 2.2 ± 0.15 |
| Kevlar absorbed with Jeffamine | 3.87 ± 0.2 |
| Jeffamine-grafted-Kevlar with $O_2$-plasma* | 5.0 ± 0.25 |
| Jeffamine-grafted-Kevlar with $N_2$-plasma** | 6.2 ± 0.3 |

*$O_2$-plasma conditions:
R.F. Power = 150 W
Flow Rate = 40 cc/min.
Duration of Treatment = 20 min.
**$N_2$-plasma conditions:
R.F. Power = 100 W
Flow Rate = 30 cc/min.
Duration of Treatment = 30 min.

A Dillon Tester Model M-550 was used to determine the peel strength (ASTM D-1867) of the grafted Kevlar fabric test samples. Kevlar strips 1 inch×6 inches were used for this test. Half of each sample (1 inch×3 inches) was coated with the following epoxy resin formulation:
"DER 332" Epoxy Resin: 100 pbw
Diethylenetriamine: 10 pbw
Two such coated strips were bonded together to form a T-peel (90°) test samples. These samples were cured for 1 hour at 100° C. The samples were tested by clamping one strip of the T-peel test sample in each of the two jaws of the test machine. The lower jaw was then moved away from the upper jaw at 10 inches per minute. The peel strength was calculated in pounds per inch width based upon the force required to initiate peeling. For each treatment at least six replicates were tested.

The table shows that the nitrogen plasma seems to product maximum peel strength, even though oxygen and argon are reasonably effective.

In the case of nitrogen plasma induced grafting, the peel strength increased with increasing exposure time, as shown in the following table:

| Gas | $N_2$ | $N_2$ | $N_2$ | $N_2$ | $O_2$ |
|---|---|---|---|---|---|
| Flow Rate | 30 cc/min. | 30 cc/min. | 30 cc/min. | 30 cc/min. | 40 cc/min. |
| Pressure | 1.0 mm | 1.0 mm | 1.0 mm | 1.0 mm | 1.05 min. |
| r.f. Power | 100 W | 100 W | 100 W | 100 W | 150 W |
| Time of Treatment | 10 min. | 30 min. | 45 min. | 60 min. | 20 min. |
| Percentage uptake of Jeffamine | 28.6 | 30.5 | 25.7 | 27.86 | 16.8 |
| Peel Strength lb/in | 4.98 ± 0.3 | 6.2 ± 0.3 | 6.5 ± 0.4 | 7.5 ± 0.45 | 5.0 ± 0.25 |

The grafting of Jeffamine was confirmed by running an ESCA (electron spectroscopy for chemical analysis) on both nongrafted and grafted Kevlar samples. After completion of the plasma induced grafting of Jeffamine, the sample was extracted with dimethyl formamide for three days and dried in a hot air oven to remove any unreacted or homopolymerized material. A significant change in composition was observed in the ESCA. A quantitative estimation of the C, N, and O composition in both the samples is given in the following table.

| Sample | PEAK AREAS (Arbitrary Units) | | | | |
|---|---|---|---|---|---|
| | C | O | N | C/N | O/N |
| Control | 189907 | 184204 | 9731 | 19.52 | 18.93 |
| Jeffamine-grafted-Kevlar | 255417 | 154685 | 29133 | 8.77 | 5.31 |

In addition to Jeffamine, other monomers were also grafted onto Kevlar. The peel strength of the grafted fabric was determined, as shown in the table which follows:

| Monomer Grafted Condition | Carboxyl Terminated Polybutadiene | N—vinylbenzyl-N—2(trimethoxy-silyl) propyl amino ethyl chloride | "DER-332" |
|---|---|---|---|
| Gas | $O_2$ | $O_2$ | Ar |
| Flow Rate | 40 cc/min | 40 cc/min. | — |
| Pressure | 1.05 mm. | 1.05 mm. | 43μ |
| RF Power | 150 W | 150 W | 10 W |
| Time of Treatment | 20 min | 20 min. | 60 min. |
| % Uptake of Monomer | 3.8 | 3.77 | 5.6 |
| Peel Strength lb/in | 3.1 ± 0.12 | 2.8 ± 0.15 | 4.69 ± 0.16 |

The peel strength was improved significantly as compared to the untreated Kevlar. The short beam shear strength of laminates made from a control and butadiene-g-Kevlar was determined to be 4465±8% and 4985±4%, respectively. SEM micrographs of the thermally cycled laminates of various samples showed that the butadiene-grafted-Kevlar and epoxy laminate had comparatively few microcracks.

We claim:
1. A method of forming a coating on an organic polymeric fibrous substrate for use in making a laminate that will exhibit reduced microcracking comprising

(A) applying a liquid which comprises an organic compound that lacks a polymerizable structure and has a vapor pressure of less than 400 mm at room temperature to said substrate;

(B) evaporating any solvent that is present in said liquid; and (C) exposing said liquid to an ionized non-polymerizing inorganic gas.

2. A method according to claim 1 wherein said organic compound is a saturated aliphatic hydrocarbon.

3. A method according to claim 2 wherein said saturated aliphatic hydrocarbon is selected from the group consisting of pentane, octane, and dodecane.

4. A method according to claim 1 wherein said liquid is a solution of said organic compound in a solvent.

5. A method according to claim 4 wherein said solvent is acetone.

6. A method according to claim 4 wherein said solvent is a non-solvent for said substrate.

7. A method according to claim 4 wherein said solvent has a boiling point under 80° C.

8. A method according to claim 1 wherein said gas is selected from the group consisting of oxygen, nitrogen, and mixtures thereof.

9. A method according to claim 1 wherein said gas is ionized using a capacitively or inductively coupled RF generator.

10. A method according to claim 1 wherein said ionized gas has a temperature near ambient.

11. A method according to claim 1 wherein said substrate is a fibrous polyaramide.

12. A method according to claim 1 wherein said organic compound has a vapor pressure less than 10 mm at room temperature.

13. A coated substrate made according to the method of claim 1.

14. A method according to claim 1 including the additional last steps of impregnating said substrate with an organic impregnating resin, heating said impregnated substrate to evaporate any solvent and to partially cure said organic impregnating resin, thereby forming a prepreg, forming a stack of a plurality of said prepregs, and heating said stack under pressure to fully cure said organic impregnating resin.

* * * * *